United States Patent [19]

Pollmeier

[11] 4,093,877

[45] June 6, 1978

[54] SEMI-CONDUCTOR SWITCHING CIRCUIT WITH TRANSISTOR SWITCHING POWER LOSS REDUCTION MEANS

[75] Inventor: Werner Pollmeier, Verl, Germany

[73] Assignee: Nixdorf Computer AG, Paderborn, Germany

[21] Appl. No.: 755,637

[22] Filed: Dec. 30, 1976

Related U.S. Application Data

[62] Division of Ser. No. 612,535, Sep. 11, 1978, Pat. No. 4,015,185.

[51] Int. Cl.² ........................................... H02M 3/155
[52] U.S. Cl. ............................... 307/270; 307/296 A; 307/300; 363/131
[58] Field of Search .............. 307/296, 297, 270, 300, 307/202; 361/91, 856; 363/131, 133

[56] References Cited

U.S. PATENT DOCUMENTS

| 3,805,094 | 4/1974 | Orlando | 307/300 |
| 3,986,052 | 10/1976 | Hunter | 307/314 |

*Primary Examiner*—Stanley D. Miller, Jr.
*Assistant Examiner*—B. P. Davies

*Attorney, Agent, or Firm*—Gifford, Chandler, VanOphem, Sheridan & Sprinkle

[57] ABSTRACT

The power loss developed in a semiconductor switch during turning on the current flowing from a DC source through a main inductor is reduced by connecting in series between the switch and the main inductor the series combination of a diode and a further inductor, with the diode being poled to pass current from the switch to the main inductor. The parallel combination of a further capacitor and a further diode is connected between a tapping on said further inductor and the junction of said series combination with the semiconductor switch. To reduce the power loss during turning-off of the current, there is connected between the junction of the semiconductor switch and the inductor two paralleled series combinations of diode and capacitor with the elements in opposite order in the branches and the diodes poled in the same direction, the junctions of the capacitors and diodes in the two series combinations being connected through a series diode-inductor combination. The series combination of semiconductor switch and inductor may be one half of a push-pull inverter circuit.

6 Claims, 4 Drawing Figures

SEMI-CONDUCTOR SWITCHING CIRCUIT WITH TRANSISTOR SWITCHING POWER LOSS REDUCTION MEANS

CROSS REFERENCE TO RELATED APPLICATIONS

This is a divisional application of Ser. No. 612,535, filed Sep. 11, 1975, and claiming German Pat. application No. 2443892 priority date of Sep. 13, 1974, and now U.S. Pat. No. 4,015,185, issued Mar. 29, 1977.

BACKGROUND OF THE INVENTION

1. Field of the Invention

This invention relates to the reduction of the power loss which occurs during the turning on and turning off of semiconductor switches, which are connected in a series with an inductor.

2. Description of the Prior Art

From German published Patent Specification No. 1049962 there is already known a circuit arrangement including at least one semiconductor switch and an inductor connected in series, in which the series combination is connected to a source of direct voltage and in which a stabilized output voltage is provided by way of the said inductance. The switching arrangement concerned also includes a diode connected in parallel with the said inductance and a capacitor connected in series with this inductor. This diode is so poled that it operates in the pass direction only in response to the voltage appearing across the said inductance when the semiconductor switch is turned off. The diode thus serves to prevent damage to the semiconductor switch through the inductive turn-off voltage appearing on the said inductor. That is, the diode acts as an arrestor element for the inductive turn-off voltage appearing on the said inductor. Because of the finite turn-off time of the diode concerned, typically on the order of 0.5 μs, the known circuit arrangement has a relatively high switching power loss. For example, if the rise time $dI_1/dt$ of the semiconductor is 16A/μs, then for a turn-off time of $t_1 = 0.5$ μs and a supply direct voltage of $U = 400$ V a peak power loss $P_1$ of:

$$P = dI_1/dt \cdot t_1 \cdot U = 16A/\mu s \cdot 0.5 \mu s \cdot 400 \, V = 3.2 KW$$

then occurs in the semiconductor switch.

For a switching frequency $f_1 = 30$ kHz of the semiconductor switch, and in consequence a periodic time of $T_1 = 1/f_1 = 33$ μs, the mean switching loss $P_1$ of the semiconductor switch concerned then amounts to:

$$P_1 = dI_1/dt \cdot t_1 \cdot \tfrac{1}{2} \cdot U \cdot t_1/T_1 = 16A/\mu s \cdot 0.5 \mu s \cdot \tfrac{1}{2} \cdot 400 \, V \cdot 0.5 \, \mu S/33 \, \mu s = 24W$$

Thus the known circuit considered operates with a relatively high switching loss.

To reduce the power loss occurring in connection with the switching of a semiconductor switch in a circuit arrangement of the known kind above considered, it is possible to introduce between the switching path of the semiconductor switch and the known series combination, consisting of inductance and capacitor, a parallel combination consisting of a further inductance and the series combination of a resistor and a diode or of a Zener diode and another diode. The diodes in the known series combination are then called on to act in the pass direction only in respect to the voltage appearing on the said further inductance when the semiconductor switch is turned off. When the diode connected in series with the Zener diode mentioned is operating in the forward direction, the Zener diode is operated in the blocked direction. In this case there results a mean switching loss $P_1$ for the semiconductor switch corresponding to the equation:

$$P_1 = U/2 \cdot \hat{I}_1/2 \cdot tv/t_1 \cdot tv/T_1$$

where $I_1$ is obtained from the relation $I_1 = U/L \cdot t_1$; and tv is the measured rise delay time of the supply direct voltage on the inductance in the series combination comprising this and the capacitor. The tv-value is typically of the order of 0.1 μs. When a further inductance having an inductance of $L = 30$ uH is used, and on the assumption of a supply direct voltage of $U = 400$ V, as well as a turn-off delay time of $t_1 = 0.5$ μs for the diode connected in parallel with the said series combination of inductor and capacitor, there is thus obtained in the present case a power loss of:

$$\frac{400V}{2} \cdot \frac{6.66A}{2} \cdot \frac{0.1 \, \mu s}{0.5 \, \mu s} \cdot \frac{0.1 \, \mu s}{33 \, \mu s} = 0.4W$$

This value of the switching loss for the semiconductor switch denotes a reduction to 1/60 of the switching loss for the previously known circuit arrangements.

Although the switching loss of the semiconductor switch is reduced to a relatively small value through the above-explained parallel combination between the semiconductor switch and the series combination consisting of inductor and capacitor, the parallel combination concerned itself introduces a substantial loss of power. This power loss is composed of two power loss components. The one power loss component occurs in the turn-on phase of the semiconductor switch; the value of this loss $P_{1'}$ is given by:

$$P_{1'} = \tfrac{1}{2} L (I_1 - I_{L1})^2 f_1$$

where L denotes the inductance of the further inductor, $I_1$ the current flowing through the semiconductor switch and $I_{L1}$ the current flowing through the inductor of the said series combinations.

The other power loss component $P_1''$ occurs in the turn-off phase of the semiconductor switch. Its value is given by:

$$Phd\,1'' = \tfrac{1}{2} L \cdot I_{L1}^2 \cdot f_1$$

For example, assuming an inductance $L = 30$ μH, a peak current $I_1 = 6.66A$, and a current $I_{L1} = 4A$ flowing through the inductance of the said series combination, the sum of the power losses in the parallel combination or in the series combination (diode and resistance or diode and Zener diode) of this parallel combination then amounts to $P_s = 10.4W$. This value is relatively high.

With the above-mentioned parallel combination consisting of a further inductance and a series combination of diode and Zener or diode and resistor, there also occurs in turning off the semiconductor switch, i.e. on setting the semiconductor switch into the non-conductive condition, an intrinsically undesirable inductive turn-off voltage on the electrode connected with the said parallel combination.

It is a primary object of the present invention to reduce the power losses occurring in connection with the switching of a semiconductor switch in a circuit arrangement of the kind initially described.

SUMMARY OF THE INVENTION

In one embodiment of the invention a semiconductor switching circuit includes a semiconductor switch having a switching path and a control electrode, said control electrode connected to a source of control signals; a voltage source; an inductor; a capacitor; a series combination comprising said inductor and said capacitor connected across said voltage source in series with said switching path; a diode; means connecting said diode in parallel with said series combination, said diode poled to pass current in response to inductive turn-off voltages appearing on said inductor; means connecting a load in parallel with said capacitor; a further inductor and a further diode; said further inductor and further diode connected in series combination coupled between said switching path and said series combination of said inductor and capacitor, said further diode poled to be energized in the forward direction in response to both turning on and turning off of said semiconductor switch; and further comprising an additional capacitor and means connecting said additional capacitor to be charged by way of said further diode by the energy stored in said further inductor, whereby the power lost upon switching said semiconductor switch is reduced.

The invention provides the advantage that at relatively little expenditure in circuit elements, the loss of power incurred upon switching the semiconductor switch in a circuit arrangement of the kind initially described may be substantially reduced and that in addition, the appearance of deleterious turn-off voltages at the semiconductor switch is avoided.

In accordance with a particularly advantageous embodiment of the invention, one terminal of the capacitor is connected to that electrode of the further diode remote from the further inductor, and its other terminal is connected to a tapping on the said further inductor. This provides the advantage of a particularly effective reduction of the power loss arising in a circuit arrangement of the kind initially described upon switching a semiconductor switch.

It is also advantageous, in the above-mentioned preferred embodiment of the invention if an additional diode is connected in parallel with the further capacitor, of which the forward direction is such that it passes current flowing through the semiconductor switch when this is turned on.

This gives the advantage that when the semiconductor switch is turned on, only a part of the current flows through the further inductance, so that when the semiconductor switch is set to the turned-off condition, no dangerously high turn-off voltage appears upon the further inductor.

In accordance with a further advantageous embodiment of the invention the semiconductor switch is a transistor of which the collector-emitter path is employed as the switching path, and its base is connected to the control circuit. This arrangement provides inexpensive circuit elements for the semiconductor switch.

In accordance with still another advantageous embodiment of the invention the inductances are formed by choke coils. This arrangement provides inexpensive circuit elements for the respective inductor.

In accordance with yet another advantageous embodiment of the invention, individual damping resistors are introduced into the respective circuit branches. This arrangement minimizes the occurrence of parasitic oscillations in the circuit arrangement with inexpensive circuit elements.

A circuit arrangement in which the series combination of an inductor and a switch is connected with a source of direct voltage, and there is connected in parallel with the inductor an additional circuit which includes at least the series combination of a diode and a capacitor, and in which the diode and the capacitor are connected in the manner set out above is already known from German published Patent Specification No. 1663155. The additional circuit protects the semiconductor components, for example a rectifier forming a direct voltage source, from damage upon actuation of the switch, and especially upon the switch being turned on. The diode of the additional circuit in fact operates as a short circuit for the current flowing in response to the turn-off voltage appearing on the inductor.

As a result of the current flowing through the additional circuit, the parallel circuit branch containing the diode as well as other circuit elements contained in the short-circuit branch must be selected such that they can sustain the loading resulting from the flow of current. In the practical construction of such protective circuit arrangement, the loading requires very high cost circuit elements, since very high values of current appear in the short-circuit branch of the circuit when extinction of the inductive turn-off voltage is to be effected.

The invention also reduces the power loss appearing upon turning off a semiconductor switch included in series combination with an inductor, while employing lightly loaded circuit elements in the additional circuit, and thus minimizing the cost of the circuit.

In order to solve this problem in accordance with a feature of the present invention, in a circuit of the above-described kind the charging circuit in series with the diode includes a choke coil and is connected with the junction point between the capacitor and the diode of the additional circuit.

By way of the connection of the capacitor with the diode of the additional circuit via a choke coil, the power stored in the capacitor can be usefully fed into the inductor. Through the discharge of the capacitor provided in the additional circuit, upon switching off the inductor, a current may be provided to the inductor by way of the choke coil, the direction of this current corresponding with that present when the inductor is turned on. The turn-off voltage of the kind described is thus prevented from accumulating in the inductor. At the same time a high power loss, such as occurs in circuit arrangements of the previously known kind, can no longer build up in the series circuit of semiconductor switch and inductor. Since the capacitor present in the additional circuit is charged only during a short period of time within the turn-on time of the semicondcutor switch, only a small additional loading of the direct voltage source is incurred, which in practice does not substantially increase the current load which is normally provided by the series combination. The invention thus effects a reduction of the turn-off power loss in the semiconductor switch.

According to the advantageous embodiment of the invention, the additional circuit includes two capacitor-diode elements, each consisting of a capacitor and a diode connected in series with it. In addition, these two capacitor-diode elements, having both diodes poled in the same direction and with opposite series connections of capacitor and diode are conncted togehter at their ends, and finally the junction point of the capacitor and the diode of one capacitor-diode element is connected with the junction point of the capacitor and the diode of the other capacitor-diode element by way of the charging circuit containing the diode and the choke coil. This provides the advantage that while requiring only small expense on circuit components, the capacitors of the capacitor-diode elements can be charged with relatively small current. Simultaneously when the diode of the said inductance-diode element is blocked, they may be charged to the voltage of the direct voltage source, to which the said series combination consisting of an inductor and the semiconductor switch is connected.

For a circuit arrangement in which the series combination is formed by the main windings of a transformer having two main windings and a respective semiconductor switch connected in series with each of the main windings, in a push-pull d.c. inverter, the invention may be embodied by connecting in parallel with each main winding a capacitor-diode element, and connecting the junction point of the capacitor and the diode of each capacitor-diode element by way of an inductance-diode element with a circuit point at a predetermined potential. This arrangement provides the advantage of a particularly effective reduction of the turn-off loss in a push-pull inverter.

It is an advantage in the last considered embodiment of the invention if, in accordance with a further advantageous embodiment of the invention, the inductance-diode element connected with the capacitor-diode elements is connected at its diode with a common inductor. This provides at particularly small expense on circuit elements for a reduction of the turn-off loss in a push-pull inverter.

According to still another advantageous embodiment of the invention, individual damping resistors are introduced into the respective circuit branches. This gives the advantage that parasitic oscillations in the whole of the circuit arrangement may be avoided at especially low cost in circuit elements.

According to still another advantageous embodiment of the invention the junction point between the semiconductor switch and the inductor of the said series combination is connected with a circuit point at a predetermined potential, advantageously ground potential, by way of a diode in the manner known per se from German published Patent Specification No. 1175321, the diode being so poled that it operates in the forward direction in response to the voltage appearing across the inductor upon opening the semiconductor switch. This arrangement provides the advantage that any voltage present on the said inductor after discharge of the capacitors provided in the additional circuit may be suppressed, so that excellent protection of the semiconductor switch is achieved.

It is an advantage in the last considered embodiment of the invention if, in accordance with yet another advantageous embodiment of the invention the diodes are connected by way of a parallel RC circuit with the circuit point carrying the predetermined potential, in the manner known per se from published German Patent Specification No. 1175321.

This provides the advantage that the turn-off voltages appearing at the junction point of the diode and the semiconductor switch can be limited to a desired value.

DESCRIPTION OF THE PREFERRED EMBODIMENTS

Figure 1:
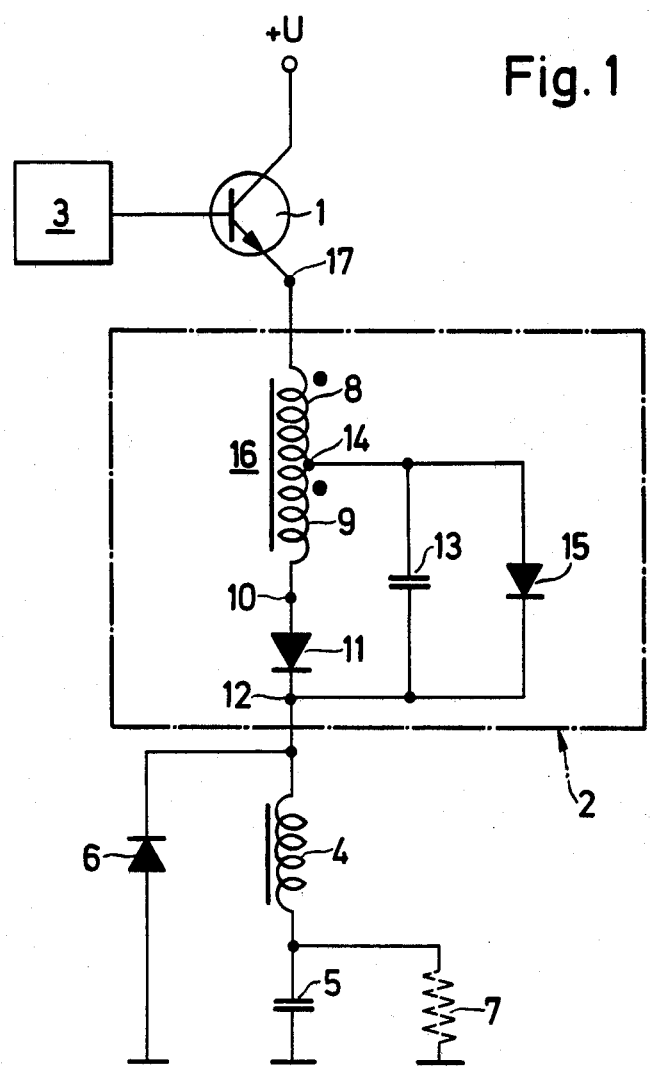
FIG. 1 shows a circuit arrangement for reducing the power loss on turning on a semiconductor switch.

The circuit arrangement represented in FIG. 1 contains a transistor 1 of npn conductivity type, acting as the semiconductor switch. This transistor 1 is connected with its collector/emitter path serving as the switching path, between a point in the circuit carrying a positive supply voltage +U and by way of a later described additional circuit 2 with one end of a series combination, consisting of an inductor 4 and a capacitor 5, of which the plate remote from that connected to inductor 4 is at ground potential. The capacitor 5 may have connected in parallel with it a load 7 indicated as a resistor. Between the junction point of the inductor 4 formed by a choke coil and the additional circuit 2 on one hand and ground on the other hand there is connected a diode 6. This diode 6 is so poled that it conducts in response to the voltage appearing on the choke coil 4 when the transistor 1 is turned off, i.e. upon a transition of the transistor 1 into the nonconductive condition. It may be remarked with reference to transistor 1 that its base is connected to a control circuit 3, which may in particular be a timing circuit. The control circuit to the base of transistor 1 may, for example, have a frequency of 30 kHz, in synchronism with which the transistor 1 is driven into the conductive or turned-on condition and into the nonconductive or turned-off condition.

The additional circuit 2 which is connected between the emitter of the transistor 1 and the end of the choke coil 4 connected to the cathode of the diode 6, contains an inductor likewise formed by a choke coil 16, with which a diode 11 is connected in series. As will be later explained, this diode 11 is operated in the forward direction only after the turning on and after the turning off of the transistor 1.

The choke coil 16 is provided with a tapping 14, which is preferably a center tap on the choke coil 16. The choke coil 16 is thus divided into two winding portions 8 and 9. These winding portions 8 and 9 of the choke coil 16 are wound in the same sense, as is indicated by the dots shown at appropriate positions on the respective windings.

A capacitor 13 has one plate connected to the tapping 14 of the choke coil 16. The other plate of capacitor 13 is connected to the junction point between the cathode of diode 11 one end of the choke coil 4 and the cathode of diode 6. The capacitor 13, together with the choke coil 16 forms an oscillatory circuit which is to some extent decoupled by the diode 11. In parallel with the capacitor 13 is connected a diode 15. The diode 15 is so poled that it conducts in the forward direction and passes current flowing through the collector-emitter path of transistor 1 and through the winding portion 8 of the choke coil 16.

The circuit arrangement of the embodiment shown in FIG. 1 having been described above, the mode of operation of this circuit arrangement will now be considered. For this purpose reference is made to the diagrams given in FIG. 2.

Figure 2:
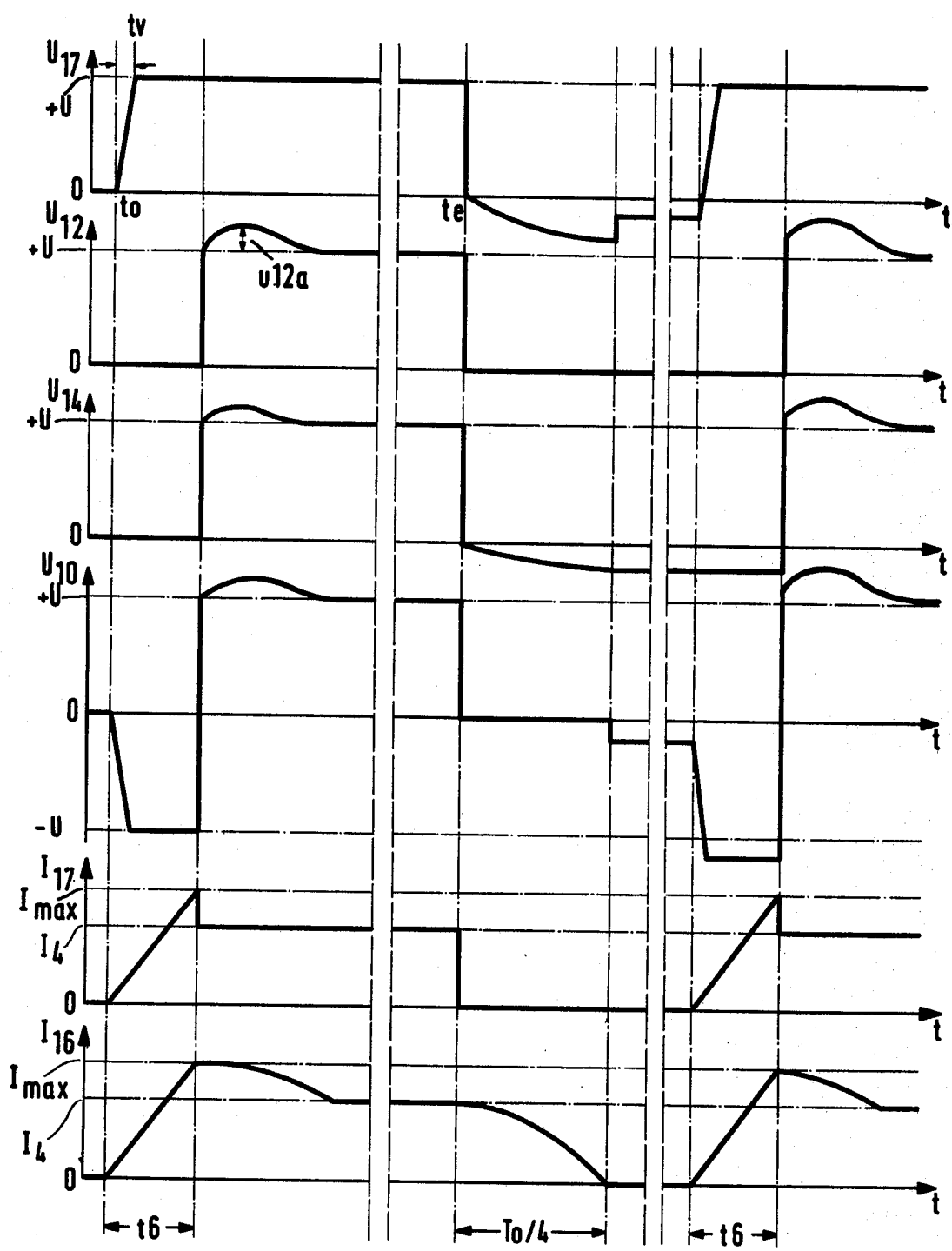
FIG. 2 shows waveforms representing the voltages and currents at different points in the circuit arrangement described in relation to FIG. 1.

In FIG. 2 the variations with time of the currents and voltages appearing at different points of the circuit arrangement represented in FIG. 1 are shown. The voltages are each designated by the character "U" and a subsequent number, which represents the number of the corresponding circuit point in the circuit arrangement of FIG. 1. The currents are designated by "I" and a subsequent number, which corresponds with the circuit component in the circuit arrangement of FIG. 1 in which the respective current flows.

At time $t0$, which is shown at the left-hand side of FIG. 2, the transistor 1 is driven into its conductive or turned-on condition. Thus the voltage $U_{17}$ at the circuit point 17 in FIG. 1 rises from OV to the supply voltage plus U. This rise in voltage occurs within a definite time interval $tv$, the rise delay time, which is typically 0.1 $\mu$s.

Because of the voltage rise at the circuit point 17 in the circuit arrangement of FIG. 1 there flows through the choke 16 a current which is designated $I_{16}$. This current thus flows through the winding portion 8 of the chock 16 as well as through the diode 15, in the pass direction, and the diode 6 to ground. Although the diode 6 is itself poled in the reverse direction for current in this direction, the current in fact flows through it owing to the blocking delay time of the diode 6. This blocking delay time, which is designated $t6$ in FIG. 2, is typically about 0.5 $\mu$s.

Within this time interval the current $I_{16}$ and thus also the current $I_{17}$ flowing at the point 17 in the circuit arrangement of FIG. 1 rises to a maximum value $I_{max}$ of for example 6.66A.

Because of the current flowing through the winding portion 8 of the choke coil 16 within the rise delay time interval $tv$, there is developed in the winding portion 9 of the choke coil 16 a voltage of such polarity that a potential of $-U$ appears at the junction point between the winding portion 9 of the choke coil 16 and the anode of the diode 11 in FIG. 1. This is shown in the waveform of voltage $U_{10}$ in FIG. 2. The diode 11 is thus blocked. After expiration of the rise delay time interval $tv$, the volage $-U$ is maintained at the junction point 10 in FIG. 1. An alteration of this potential first occurs at the end of the diode blocking delay time $t6$ of the diode 6.

After expiration of the diode blocking delay time $t6$ of diode 6, the diode 6 passes into the blocked condition. This has as a consequence, that the current $I_{17}$ falls to a value $I_4$. This value $I_4$ is the value of the current flowing through the choke coil 4. In addition, the voltage at the circuit points 10, 12, and 14 in FIG. 1 rises to the value of the supply voltage $+U$. The energy stored in the inductance of the winding portion 8 of the choke coil 16, which is given by the equation:

$$W_{8\,Ein} = \tfrac{1}{2} L_8 \cdot (I_{17} - I_4)^2$$

produces by way of the winding portion 9 of the choke coil 16 as well as the diode 1 now operating in the forward direction, charging of the capacitor 13, such that a rise in voltage occurs at its plate connected to the choke coil 4.

This rise in voltage is designated u12a in FIG. 2 and its value is given by the equation:

$$u12a = 2 \cdot z \, (I_9 - I4) ;$$

where $I_9$ represents the current flowing through the winding portion 9 of the choke coil 16, $I_4$ the current flowing through the choke coil 4 and z the circuit resistance of the oscillatory circuit including the inductance of the winding portion 9 of the choke coil 16 and the capacitance of the capacitor 13. Here $$Z = \sqrt{L_9 / c_{13}}.$$

Here $L_9$ denotes the inductance of the winding portion 9 of the choke coil 16 and $C_{13}$ the capacitance of the capacitor 13.

Voltage rises also appear at the circuit points 10 and 14 within the time interval now considered, as may be seen in FIG. 2. The value of these voltage rises amounts however to some $(I_9 - I_4)z$; the respective voltages rises are thus only about half as large as the voltage rise at the circuit point 12 in the circuit arrangement of FIG. 1.

For a flow of current of appoximately 50% of the period in the oscillatory circuit including the diode 11, there occurs as a result of the additional circuit 2 in the circuit arrangement of FIG. 1 a power loss $P_2$ corresponding to the following equation:

$$P_2 \approx I_4 \cdot \tfrac{1}{2} \cdot U_{11}.$$

Here $I_4$ denotes the current flowing through the choke coil 4, which in the example assumed may amount to 4A, and $U_{11}$ the forward voltage drop on diode 11. This diode forwad voltage 11 is typically of the order of 1.2V. Assuming the values given immediately above, there results a power loss $P_2$ of:

$$P_2 \approx 4A \cdot \tfrac{1}{2} 1.2 \, V = 2.4W.$$

This value of the power loss introduced by the additional circuit 2 represents a considerable diminution of the power loss occurring when turning on the semiconductor switch, in comparison with the circuit arrangement considered previously. It is true that the loss resulting from the choke coil 16 is not taken into account (the same applies however for the calculation set out for the circuit arrangement considered seriously. The value of the power loss resulting from the choke coil 16 amounts typically to less than 1W.

The relations during the switching-off phase of transistor 1 will now be considered.

At an instant $t_e$ the transistor is driven into the nonconductive or switched-off condition. The voltage at the circuit point 17 in the circuit of FIG. 1 then falls to OV. The same thing applies to the circuit points 10, 12 and 14. The current $I_{17}$ likewise falls abruptly to zero. Within a quarter-period (To/4) of the oscillatory circuit including the winding portion 9 of the choke 16 and the capacitor 13, however the current $I_{16}$ flowing in the choke coil 16 and likewise in the winding portion 9 of choke 16 falls to zero. Owing to this flow of current, as is shown in FIG. 2, there occurs a reduction in voltage at the circuit points 14 and 17 in FIG. 1. The drop in voltage at circuit point 17 has an amplitude of $2.I_4.z$, and the voltage drop at the circuit point 14 has an amplitude of $I_4.z$. At the end of the time period To/4, as shown in FIG. 2, thus with the cessation of the flow of current $I_{16}$, the voltage at the circuit point 17 rises to an amplitude which is equal to $I_4.z$. The voltage $U_{14}$ at the circuit point 14 of FIG. 1 remains, on the other hand, at the value previously obtained. Because of the previously mentioned rise in voltage $U_{17}$, the voltage $U_{10}$, however, falls. This fall in voltage likewise has the amplitude $I_4 \cdot z$. It should be remembered that, as already stated, z represents the circuit resistance of the oscillatory circuit including the winding portion 9 and the capacitor 13.

Owing to the above-discussed processes in the switching-off phase of the transistor 1, it results that the energy component $W_{8''}$ in the winding portion 8 of the choke coil 16, given by the equation:

$$W_{8''} = \tfrac{1}{2} \cdot L_8 \cdot I_4^2$$

is stored in the capacitor 13 by way of the diode 11, now operating in the forward direction.

When transistor 1 is turned on again, i.e. with the transition of the transistor 1 into the conductive condition, the voltage $U_{17}$ rises again to the supply voltage $+U$. After expiration of the diode blocking delay period t6 of the diode 6, the voltages $U_{12}$, $U_{14}$ and $U_{10}$ at the circuit points 12, 14 and 10 in FIG. 1, also rise towards the supply voltage $+U$. As is shown in FIG. 2, higher voltage rises now occur. The voltage rise at the circuit points 12 and 10 now amount however to $2 \cdot I_8 \cdot z$ while the voltage rise at the circuit point 14 amounts to some $I_8 \cdot z$. These voltage rises result from the voltage stored on the capacitor 13. With reference to the reduction of the voltage $U_{10}$ within the last considered diode blocking delay time of the diode 6, it is remarked that this possesses a value which is equal to the product $I_4 \cdot z$. Regarding the circuit arrangement shown in FIG. 1, it thus results that its additional circuit 2 gives rise merely to a relatively small voltage loss, e.g. of 2.4W in comparison to 10.4W in a circuit arrangement in which there is introduced between the switching path of a semiconductor switch and a series combination of choke 4 and capacitor 5, an additional circuit consisting of a corresponding series combination with a diode corresponding to the diode 6, which consists of the parallel combination of an inductance on the one hand and the series combination of a diode and a resistor or a diode and a Zener diode on the other hand. On the assumption of like values for the supply voltage, the current flowing through the switching path of the transistor 1, the blocking delay time, the rise delay time of the supply voltage with the semiconductor switch turned on and the periodic time of the control impulses applied to control the transistor 1, as for the circuit arrangement with the just-mentioned parallel circuit, there results in the present case a turn-on power loss of merely 0.4W.

With reference to the circuit arrangement shown in FIG. 1, it is remarked that because of its characteristics the diode 15, which allows the emitter current of the transistor 1 to flow only through the winding portion 8 of the choke coil 16, ensures that upon switching off the transistor 1, that is on a transition into the nonconductive condition, no disadvantageous additional increase in the inductive turn-off voltage appears at this transistor.

It is remarked with reference to the diode 11, that as regards its blocking delay time the circuit arrangement is so arranged that after switching off of the transistor 1 into the nonconductive condition, this transistor 1 is only turned on again into its conductive condition if the current flowing through the diode 11 is approximately zero.

Finally, it is remarked that as a modification of the arrangement represented in FIG. 1, the additional circuit arrangement 2 could also be constructed in such a manner that the diode 11 is inserted between the end of the winding portion 8 connected with the transistor 1 and the emitter of that transistor. In this case the capacitor 13 and if necessary the diode 15 would be connected between the emitter of the transistor 1 and the tapping 14 of the choke coil 16.

Figure 3:
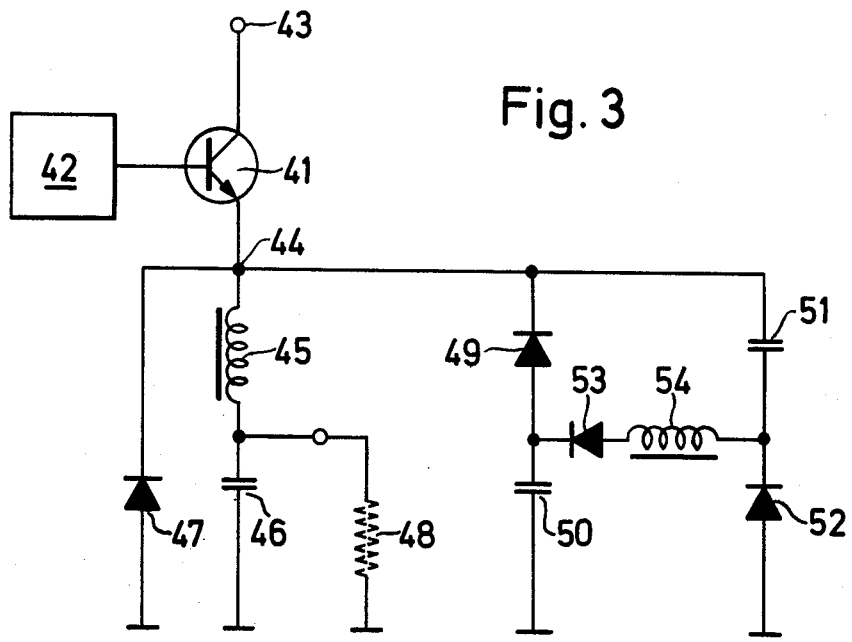
FIG. 3 shows a circuit arrangement for reducing the power loss on turning off a semiconductor switch.

In FIG. 3 there is shown a circuit arrangement of a semiconductor switch formed by an npn transistor 41 and an inductor 45. The collector-emitter path of the transistor 41 is connected with the inductor 45. This series combination, i.e., transistor 41 and inductor 45, is connected in the present case by way of a capacitor 46 to a source of direct voltage, represented only by a terminal 43 and the ground symbol. In parallel with the capacitor 46 there is connected a load, represented only by a resistor 48 shown in broken line. To the junction point 44 between the emitter of transistor 41 and the inductor 45 there is connected the cathode of a diode 47; the anode of this diode 47 is connected to ground. The diode 47 is thus connected in the blocking direction as regards voltage applied to the inductor 45 in response to a current flowing through the collector-emitter path of the transistor 41. The base of the transistor 41 is connected to a control circuit 42, which pulsewise opens and closes the transistor 41. The circuit arrangement so far described thus represents a switching regulator.

Because of the pulsewise switching on and off of the transistor 41, inductive switching off voltages appear on the inductor 45 at each switching-off of the transistor 41. These switching-off voltages possess a polarity such that a current resulting therefrom may flow through the diode 47.

In order to demonstrate the loadings occurring in this previously described circuit construction, an embodiment is briefly considered below. In this the following values are assumed:

$U_B = 400$ V
$I_E = 4$ A
$f_w = 30$ kHz
$T_w = 1/f_w = 33$ μs
$t_v = 0.4$ μs

Here $U_B$ denotes the direct voltage applied between the terminal 43 and ground, $I_E$ the emitter current of the transistor 41, $f_w$ the frequency of the control or switching pulses applied to the base of the transistor 41, $T_w$ the periodic time of $f_w$ and $t_v$ a particular time of current fall in the transistor 1 on its transition from the conductive into the nonconductive condition.

Assuming the values given above, there results for the transistor 41 a switching power:

$P_S = I_E \cdot U_B = 4A \cdot 400V = 1.6 kW.$

The mean turn-off switching loss of the transistor 41 amounts to:

$$P_{v1} = U_B \cdot \frac{I_E}{2} \cdot \frac{t_v}{T_w} = 400V \cdot \frac{4A}{2} \cdot \frac{0.4\ \mu s}{33\ \mu s} = 9.7W.$$

This relatively high turn-off loss power of the transistor 41 is now substantially reduced by the additional circuit arrangement represented in FIG. 3. The additional circuit arrangement includes in the present case two capacitor-diode elements or series combinations connected in parallel with each other. Each element consists of a capacitor 50, 51 and a diode 49, 52 respectively. The two capacitor-diode elements 49, 50 and 51, 52 are connected together at their ends; one pair of ends being connected to ground and the other pair of ends to the connecting point 44. In the two capacitor-diode elements 49, 50 and 51, 52 the capacitors and diodes are connected in different sequences; the two diodes 49 and 50 are however poled in the same direction. The junction point between the diode 49 and the capacitor 50 of one capacitor-diode element is connected with the junction point between the capacitor 51 and the diode 52 of the other capacitor-diode element by way of a choke-diode element, which consists of a choke coil 51 and a diode 53 connected in series therewith. The sequence in which choke coil 54 and diode 53 are connected is insignificant. The choke coil 54 forms an oscillatory circuit with the two capacitors 50, 51.

The diode 53 is so poled that it is in the forward direction as regards a current from junction point 44 charging the capacitors 50 and 51 by way of the choke coil 54. To illustrate the operations now taking place it is assumed that the transistor 41 is in the nonconductive condition and that the capacitors 50, 51 are discharged.

If the transistor 41 is driven into the conductive condition, then a current flows through the inductor 45, and in addition a charging current flows through the capacitor 51, the choke coil 54, the diode 53 and the capacitor 50. The diode 49 and 52 are blocked during the course of charging of the capacitors 50 and 51. This charging takes place practically until the current in the choke coil 54 has reached zero value. Finally, the diode 53 is then blocked.

As the charging current commences to diminish, the choke coil 54 provides from its stored magnetic energy a further current, which flows on the one hand through the diode 53, the diode 49 and the capacitor 51 and on the other hand also by way of the diode 53 the capacitor 50 and the diode 52. In this manner the capacitors 50 and 51 are still further charged. When this charging operation ceases, then there appears on the capacitors 50 and 51 voltages which correspond to the voltage between the circuit point 43 and ground in the circuit arrangement of FIG. 3. The diode 49, 52 and 53 are now blocked.

If now the transistor 41 changes over into its nonconductive condition, then the capacitors 50 and 51 provide a current - replacing that of the transistor 41, which flows for a certain time period through the inductance 45 as well as the capacitor 46, and possibly the low resistor 48. As a result of this current flowing through the inductor 45 and slowly diminishing, there appears on the inductor 45 substantially no turn-off voltage likely to damage the transistor 41. Any turn-off voltage appearing on the inductor 45 - already substantially reduced however - is made ineffective by reason of the presence of diode 47.

In what follows the power relations will be considered which result in the circuit arrangement described above. First of all, it is remarked that the capacitors 50 and 51 connected with the inductor 45 have the effect, as has been explained above, that when the transistor 41 changes over into the nonconductive condition, the voltage at the connecting point 44, with reference to ground, does not diminish abruptly, but gradually after a certain delay time t1; this delay time t1 may amount for example to 2 $\mu s$. For a current drop time $t_v$ within which the emitter current of the transistor 41 falls to zero, there thus results the following turn-off power loss $P_{V1}$ for the transistor 41:

$$P_{V1} = U_B/2 \cdot t_v/t1 \cdot I_E/2 \cdot t_v/T_w$$

Taking into account the values given above for the individual magnitudes, there thus results for the transistor 41 a turn-off power loss of:

$$P_{V1} = \frac{400V}{2} \cdot \frac{0.4\ \mu s}{2\ \mu s} \cdot \frac{4A}{2} \cdot \frac{0.4\ \mu s}{33\ \mu s} = 0.97W$$

Thus by the use of capacitors 50 and 51 the turn-off power loss of the transistor 41 in the circuit arrangement according to FIG. 3 is reduced to 1/10 of the above-calculated turn-off power loss, that is, of the turn-off power loss when the additional circuit in the right-hand part of FIG. 3 is not used.

The power loss will now be considered, which results from the additional circuit, including the capacitors 50 and 51 and the choke-diode element including the diode 53 and the choke coil 54, that is the power loss in the oscillatory circuit. It is here assumed that a capacitance of 10nF per capacitor 50, 51 and an inductance of 5.6nH for the choke coil 54 and for a circuit resistance z of 1 kOhm, the peak value of the charging current flowing through the choke 54 is:

$$\hat{I}_{14} = U_B/z = 400V/1k = 0.4A$$

The effective value of the charging current $I_{14\text{eff}}$ amounts to:

$$I_{14\text{eff}} = \hat{I}_{14}/\sqrt{2} \cdot \sqrt{K}$$

so that $T_O = T_w$ $K =$ tune of current flow/$T_w = 0.5\ T_O/T_w = 0.5$ where $T_O$ denotes the periodic time of the resonant frequency $f_o$ of the oscillatory circuit. Thus $$I_{14\text{eff}} = \hat{I}_{14}/\sqrt{2}\ \sqrt{0.5} = 0.2A.$$

In a practical embodiment, the choke coil 54 had an inductance of 5.62mH, and a series resistance $R_S$ of 5ohms. This signifies that the loss power $P_{V14}$ resulting from the series resistance of the choke coil 54 in the oscillatory circuit including the capacitors 50 and 51 and the choke coil 54 has the following value:

$$P_{V14} = (I_{14\text{eff}})^2 \cdot R_S = (0.2A)^2 \cdot 5 = 0.2W$$

For a forward voltage drop of $U_D$, the power loss $P_{V13}$ in the diode 53 amounts to:

$$P_{V13} = U_D \cdot I_m = U_D \cdot \hat{I}_{14} \cdot 2/\pi \tfrac{1}{2} = 0.13W.$$

The total power loss $P_Z$ of the circuit arrangement connected with the connecting point 44 in the circuit arrangement shown in FIG. 3 that is, of the circuit arrangement shown in the right-hand part of FIG. 3 thus amounts to:

$$P_Z = 0.2W + 0.13W = 0.33W.$$

This power loss $P_Z$ is relatively small in relation to the turn-off power loss $P_{V1}$ developed in the transistor 41.

The above described advantageous results are to be attributed to the fact that the charging power of the capacitors is utilized in the inductor 45 upon opening the semiconductor switch.

Figure 4:
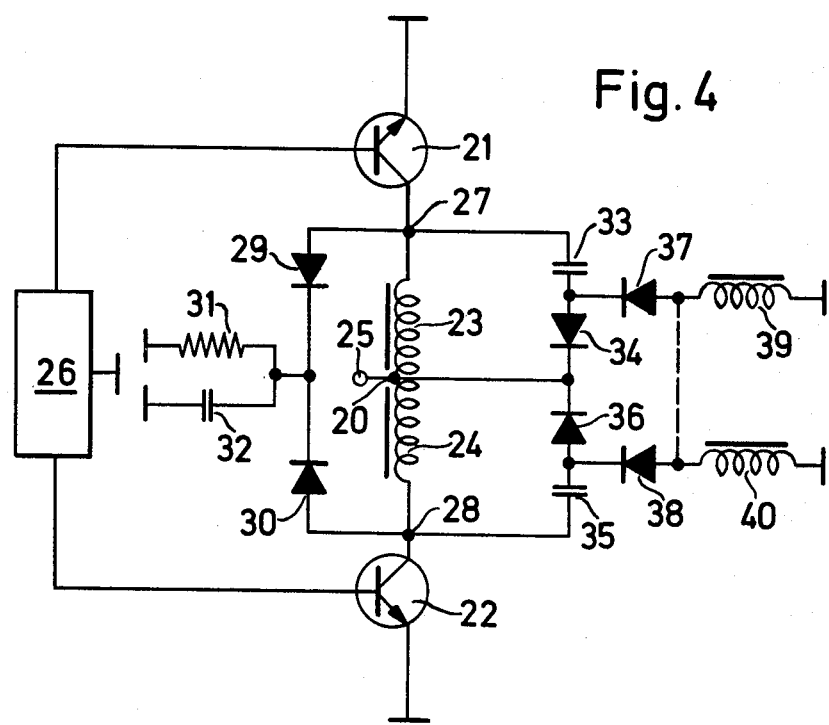
FIG. 4 shows a push-pull inverter circuit embodying the invention.

The circuit arrangement represented in FIG. 4 will now be considered. This circuit arrangement comprises substantially a push-pull inverter circuit, comprising two npn transistors 21 and 22, of which the collector-emitter paths are each connected to one of the two main windings 23, 24 of a transformer; the emitters of the transistors 20, 21 being connected to ground. The common connecting point 20 of the two transformer windings 23, 24 is connected to a terminal 25, which in the present case receives a positive direct voltage. The bases of the two transistors 21 and 22 are connected with a control circuit 26, which normally includes two mutually coupled further windings of the said transformer. The ends of the respective mutually coupled windings (not shown) are coupled with the bases of the transistors 21, 22 and there mutually connected ends are connected by way of a resistor to ground.

To the junction points 27 and 28 between the collectors of respective transistors 21 and 22 and the ends of the two main windings 23, 24, diodes 29 and 30 are connected in a manner similar to that of the circuit arrangement of FIG. 3. The diodes 29, 30 have their anodes connected to the said junction points 27 and 28 respectively. The cathodes of the two diodes 29 and 30 are connected with one another; they are connected by way of a common parallel RC element, including a resistor 31 and a capacitor 32, to ground. The significance of this circuit, including the diodes 29, 30 and the parallel RC element with the resistor 31 and the capacitor 32 is explained below.

In parallel with each of the two main windings 23, 24 of the transformer of the push-pull inverter there is connected a respective capacitor-diode element, consisting of a capacitor 33, 35 and a series-connected diode 34, 36 respectively. The two diodes 34, 36 are so poled that they are in the blocking direction as regards the voltage appearing on the respective main winding 23 or 24 of the said transformer as a result of the flow of current through the collector-emitter path of the transistor 21 or 22 connected with the respective main winding, 23, 24. To the junction point of the capacitor 33 with the diode 34, and also to the junction point of the capacitor 35 with the diode 36 there is connected a respective inductor-diode element, which is returned to ground. One inductor-diode element contains a diode 37 and an inductor 39, while the other inductor-diode element contains a diode 38 and an inductor 40. The two inductor-diode elements are connected to ground by way of the ends of the inductors 39 and 40. It is remarked at this point that the sequence of diodes 37 and 38 and their respective inductors 39 and 40 may also be interchanged. The inductors 39, 40 form a separate oscillatory circuit, with the capacitors 33, 35.

The diodes 37 and 38 of the inductor-diode elements are so poled that when the respective transistors 21 and 22 are driven into the conductive condition, after a certain time interval, the diodes 37 and 38 conduct and, in fact, operate in a manner similar to the diode 53 in FIG. 3. In order to be able to understand the processes which come into play in this connection, consider the main winding 23 of the transformer of the push-pull inverter of FIG. 4. It is assumed that the terminal 25 of the circuit arrangement of FIG. 4 receives a direct voltage of +200V.

If the transistor 21 is in the nonconductive condition and the transistor 22 in the conductive condition then there is applied between the plates of the capacitor 33 a voltage of 200 V. The junction point 27 applies a potential of +400 V, the other side of the capacitor 33 receives a potential of +200 V. If the transistor 21 is then changed over into the conductive condition, then the potential on the plate of the capacitor 33 connected with the junction point 27 is more or less abruptly reduced to zero. As a result the potential on the other plate of the capacitor 33 jumps to −200 V. Thus a current flows through the capacitor 33, the diode 37 and the inductor 39, which together with the capacitor 33 forms an oscillatory circuit. When, in the course of the charging operation, the voltage on the plate of the capacitor 33 connected to the cathode of the diode 37 has fallen to zero — at which instant the peak current flowing through the inductor 39 possesses its maximum value — a voltage appears across the inductor 39. This has the result that now the plate of the capacitor 33 connected with the cathode of the diode 37 is further charged to a positive potential, which corresponds to the positive direct voltage applied to the terminal 25. Also, after this further charging of the capacitor 33 the diode 34 is blocked. After the energy of inductor 39 has been yielded up to capacitor 33, the diode 37 is again blocked.

If the transistor 21 now changes over again into its nonconductive condition, then the charge capacitor 33 supplies by way of the diode 34 connected in series with it, during a further time interval, a current which flows through the main winding 23 of the transformer of the push-pull inverter, i.e., through that main winding 23 through which the collector-emitter current of the transistor 21, which is now in the nonconductive condition, formerly flowed. Expressed in other words, this means that the capacitor 33 in the case considered takes over or continues the current flowing through the main winding 23 for a certain time interval following switching off of transistor 21. As in the current arrangement of FIG. 3, this has the result that practically no turn-off voltage capable of damaging the transistor 21 is developed across the main winding 23.

The same applies in general to the other transistor 22 provided in the circuit arrangement of FIG. 4, especially in connection with the auxiliary circuit connected with it including not only the capacitor-diode element comprising the capacitor 35 and the diode 36 but also the diode-inductance element comprising the diode 38 and the inductor 40. In this case the inductor 40 and the capacitor 35 form an oscillatory circuit, which corresponds to the oscillatory circuit which is formed by the capacitor 33 and the inductance 39.

If a turn-off voltage appears on the respective main winding 23 or 24 of the transformer of the push-pull inverter even after the operation of the additional circuit considered, then in addition to the capacitor-diode elements comprising the capacitors 33, 35 and the diodes 34, 36 and the diodes 29, 30 with series-connected parallel RC element 31, 32 come into effect. The magnitude of the voltage thus drops on the parallel RC element, comprising the resistor 31 and the capacitor 32, fixes the value at which the last-mentioned turn-off voltage will be finally limited.

Taking into account the fact that the inductors 39, 40 are operative to charge the capacitors 33 or 34 only during half of the periodic time $T_w$ of the oscillatory frequency $F_w$ of the push-pull inverter, it results that during the respective other half of the periodic time $T_w$ the respective inductor 39 or 40 is not made use of in the circuit arrangement shown in FIG. 4.

If however, as is indicated by a broken line in FIG. 4, a connection is made between the anodes of the two diodes 37 and 38 and one of the two inductors 39, 40 is omitted, then the remaining inductance 39 or 40 is used twice. In other words, the inductance 39 or 40 then remaining in the circit arrangement of FIG. 4 is made use of successively in the charging and discharging of the capacitors 33 and 35 during successive halves of the periodic time $T_w$.

The power conditions in the circuit arrangement represented in FIG. 4 are now considered. Assuming a direct voltage of $U_B = +200$ V applied to the terminal 25, a collector-emitter current $I_E$ in the respective transistor 21, 22 of 4A as well as a switching frequency $f_w$ of 30kHz, a current turn-off time $t_v = 0.4$ μs for the respective transistors 21, 22 and a turn-off delay time $t_1 = 2$ μs for the voltage on the respective main winding of the transformer of the push-pull inverter, there results for each of the transistors 21, 22 a turn-off power loss $P_{V21/22} = 0.97$W. For example, assume a capacitance of 20nF for each capacitor 33, 35 an inductance of 1.42mH for each of the inductors 39 and 40 and a series resistance $R_S = 1.25$ Ohm for each inductor. Then by using the equations developed in connection with the circuit arrangement shown in FIG. 3 for the circuit arrangement shown in the right-hand side of FIG. 4, namely an oscillatory circuit with diodes 37 or 38 between the capacitor 33 or 35 and the inductor 39 or 40, the following power losses result: The power loss $P_{V39/40}$ resulting from the series resistance of the inductance 39 or 40 amounts to $$P_{V39/40} = 0.4 \text{ W},$$

The power loss $P_{V37/38}$ of the diode 37 or 38, assuming a forward voltage $U_D = 1$V amounts to $$P_{V37/38} = 0.26\text{W}$$

Thus the total power loss in the oscillatory circuit of the circuit arrangement shown in FIG. 4, and thus of the additional circuit amounts to:

$$P_V = P_{V37} + P_{V38} + P_{V39/40} = 2 \cdot 0.26\text{W} + 0.4\text{W} = 0.92\text{W}$$

This total power loss of the additional circuit shown in the right-hand part of FIG. 4 is thus likewise lower than the turn-off power loss of the transistors of the circuit arrangement. As for the circut arrangement shown in FIG. 3, the value of the total power loss of the respective additional circuit is substantially lower than the corresponding circuit arrangements which include merely the represented capacitor-diode elements including the diodes 34, 36 of the capacitors 33, 35, without using the inductance-diode element represented in FIG. 4, comprising the diodes 37 and 38 and the inductors 39, 40, a further resistor being connected in parallel with the respective diodes. If the values previously given in connection with FIG. 4 are assumed, such a connection of the main windings 23, 24 of the transformer of the push-pull inverter shown in FIG. 4 thus gives rise, as has been shown, to a power loss of 96W. Thus by the use of the present invention, the power loss is reduced to about 1/100th of the original power loss.

The preceding description shows that embodiments of the invention make possible the reduction of the power loss in the series combination of a semiconductor switch and an inductor, for the case of switching on and switching off. Obviously the invention is not limited to the embodiments illustrated, but in particular, it is possible to combine together the arrangements for the reduction of turn-on and turn-off losses which are shown in FIGS. 1 and 3. It is likewise possible to employ in a push-pull inverter according to FIG. 4, the arrangements for the case of turning on which are described in relation to FIG. 1.

I claim:

1. A semiconductor switching circuit comprising a direct current source; a semiconductor switch; and an inductor; said semiconductor switch and said inductor connected in series combination to said direct current source; means for deriving an output voltage from said inductor; a diode; a capacitor; an additional circuit including said diode and said capacitor connected in a first series combination; means connecting said series combination in parallel with said inductor; with said diode poled in the blocking direction as regards direct voltage applied to said inductor from said direct current source; a charging circuit coupled with said capacitor, said charging circuit including a further diode, with said further diode poled to pass current in response to direct voltage applied thereto from said source by way of said semiconductor switch; said charging circuit further including a choke coil, with said choke coil connected in series combination with said further diode and connected between said further diode and said capacitor; whereby the power loss occurring upon switching off said semiconductor switch is reduced.

2. A semiconductor switching circuit as claimed in claim 1, wherein said additional circuit includes a further capacitor and a further diode, with said further capacitor and further diode connected in a second series combination, means connecting said first and second series combinations mutually in parallel, with said diode and said further diode connected in like polarity and with the order of said diode and said capacitor in said first series combination being opposite to the order of said further diode and said further capacitor in said second series combination; and means connecting said charging circuit between the junction of said capacitor and said diode in said first series combination and the junction of said further diode with said further capacitor in said second series combination.

3. A semiconductor switching circuit as claimed in claim 1, comprising two said semiconductor switches and a transformer having push-pull main windings, with each of said main windings connected in series combination with a respective one of said two semiconductor switches to form a push-pull inverter circuit; means connecting a first supplementary series combination including a first supplementary diode and a first supplementary capacitor in parallel with one of said main windings and means connecting a second supplementary series combination including a second supplementary diode and a second supplementary capacitor in parallel with the other of said main windings; and means coupling each of the junction point of said first supplementary diode with said first supplementary capacitor and the junction of said second supplementary diode by way of a series inductor-diode combination with said second supplementary capacitor with a circuit point at constant potential.

4. A semiconductor switching circuit as claimed in claim 3, wherein said series inductor diode combinations are formed by a common inductor connected with each of said junction points by way of a respective diode.

5. A semiconductor switching circuit as claimed in claim 1, wherein individual damping resistors are included in the respective branches of the circuit.

6. A semiconductor switching circuit as claimed in claim 1 and comprising a circuit point at constant potential and means including a diode connecting the junction point between said semiconductor switch and said inductor with said circuit point at constant potential.

* * * * *

UNITED STATES PATENT AND TRADEMARK OFFICE
CERTIFICATE OF CORRECTION

PATENT NO. : 4,093,877
DATED : June 6, 1978
INVENTOR(S) : Werner Pollmeier

It is certified that error appears in the above-identified patent and that said Letters Patent are hereby corrected as shown below:

Column 5, line 3, delete "conncted" and insert --connected-- therefor;

Column 7, line 63, delete "1" and insert --11-- therefor;

Column 8, line 32, delete "forwad" and insert --forward-- therefor;

Column 8, line 44, delete "seriously" and insert --previously-- therefor;

Column 14, line 37, delete "current" and insert --circuit-- therefor;

Column 15, line 40, delete "circut" and insert --circuit-- therefor.

Signed and Sealed this

Nineteenth Day of December 1978

[SEAL]

Attest:

RUTH C. MASON
Attesting Officer

DONALD W. BANNER
Commissioner of Patents and Trademarks